(12) United States Patent
Brown et al.

(10) Patent No.: US 11,282,737 B2
(45) Date of Patent: Mar. 22, 2022

(54) MOVING SUBSTRATE TRANSFER CHAMBER

(71) Applicant: LAM RESEARCH CORPORATION, Fremont, CA (US)

(72) Inventors: Daniel Arthur Brown, Pleasanton, CA (US); Leonard John Sharpless, Fremont, CA (US); Allan Kent Ronne, Santa Clara, CA (US); Christopher William Burkhart, Los Gatos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/969,857

(22) PCT Filed: Feb. 15, 2019

(86) PCT No.: PCT/US2019/018174
§ 371 (c)(1),
(2) Date: Aug. 13, 2020

(87) PCT Pub. No.: WO2019/161169
PCT Pub. Date: Aug. 22, 2019

(65) Prior Publication Data
US 2020/0381285 A1    Dec. 3, 2020

Related U.S. Application Data

(60) Provisional application No. 62/631,057, filed on Feb. 15, 2018.

(51) Int. Cl.
*H01L 21/677* (2006.01)
*H01L 21/687* (2006.01)
*H01L 21/683* (2006.01)

(52) U.S. Cl.
CPC .... *H01L 21/6838* (2013.01); *H01L 21/67706* (2013.01); *H01L 21/68707* (2013.01)

(58) Field of Classification Search
None
See application file for complete search history.

(56) References Cited

U.S. PATENT DOCUMENTS 5,202,716 A * 4/1993 Tateyama ............... B29C 31/00
                                                    396/612
6,238,161 B1 * 5/2001 Kirkpatrick ....... H01L 21/67173
                                                    414/217

(Continued)

FOREIGN PATENT DOCUMENTS

JP      10144765 A   *  5/1998
JP      2011233788 A    11/2011
JP      2017017154 A    1/2017

OTHER PUBLICATIONS

International Search Report and Written Opinion of the ISA issued in PCT/US2019/018174, dated Jun. 5, 2019; ISA/KR.

*Primary Examiner* — Gerald McClain

(57) ABSTRACT

A substrate processing tool includes a plurality of process modules configured to process a semiconductor substrate. Each of the plurality of process modules is arranged at a different location within the substrate processing tool. A vacuum transfer module (VTM) includes a robot and is configured to move between a plurality of different positions corresponding to the different locations within the substrate processing tool to allow the robot to access respective ones of the plurality of process modules.

16 Claims, 5 Drawing Sheets

(56) References Cited

U.S. PATENT DOCUMENTS

| | | | |
|---|---|---|---|
| 7,874,781 B2* | 1/2011 | Nozawa | H01L 21/67167 414/217 |
| 9,558,978 B2* | 1/2017 | Widmann | H01L 21/67733 |
| 2004/0151562 A1* | 8/2004 | Hofmeister | H01L 21/67167 414/217 |
| 2006/0285945 A1* | 12/2006 | Hofmeister | H01L 21/67173 414/217 |
| 2011/0238201 A1* | 9/2011 | Hiroki | H01L 21/67196 700/112 |
| 2013/0071218 A1† | 3/2013 | Hosek | |
| 2015/0013910 A1† | 1/2015 | Krupyshev | |
| 2015/0071737 A1† | 3/2015 | Hofmeister | |
| 2015/0086300 A1 | 3/2015 | Roub et al. | |
| 2016/0111309 A1 | 4/2016 | Lill et al. | |
| 2017/0004984 A1 | 1/2017 | Nagaike et al. | |

\* cited by examiner
† cited by third party

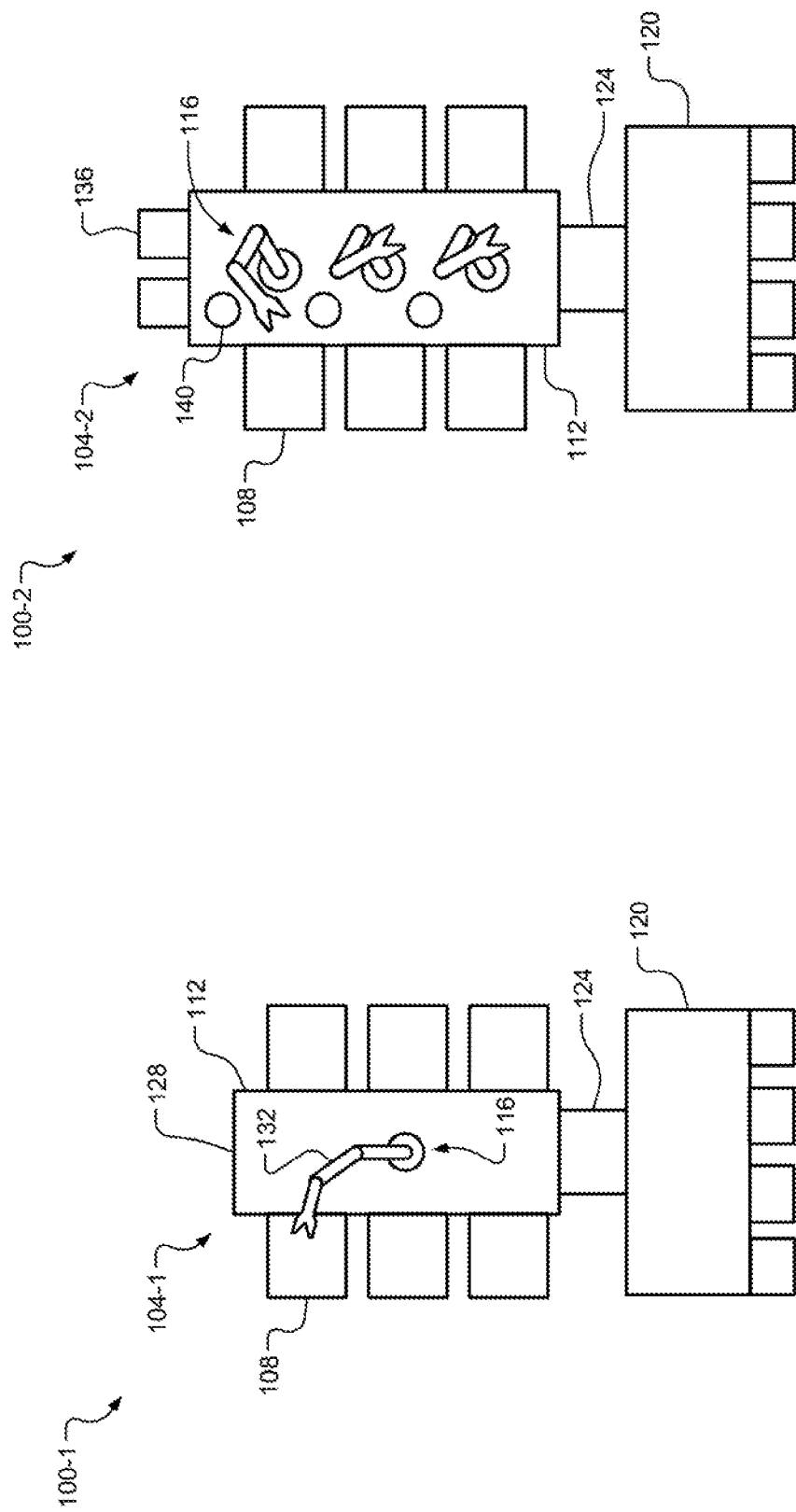

MOVING SUBSTRATE TRANSFER CHAMBER

CROSS-REFERENCE TO RELATED APPLICATIONS

This application is a U.S. National Phase Application under 35 U.S.C. 371 of International Application No. PCT/US2019/018174, filed on Feb. 15, 2019, which claims the benefit of U.S. Provisional Application No. 62/631,057, filed on Feb. 15, 2018. The entire disclosures of the applications referenced above are incorporated herein by reference.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to perform deposition, etching and/or other treatment of substrates such as semiconductor wafers. During processing, a substrate is arranged on a substrate support in a processing chamber of the substrate processing system. Gas mixtures including one or more precursors are introduced into the processing chamber and plasma may be struck to activate chemical reactions.

The substrate processing system may include a plurality of substrate processing tools arranged within a fabrication room. Each of the substrate processing tools may include a plurality of process modules. Typically, a substrate processing tool may include 4, 5, or 6 process modules clustered around a vacuum transfer module in a radial arrangement (i.e., in a radial cluster).

SUMMARY

A substrate processing tool includes a plurality of process modules configured to process a semiconductor substrate. Each of the plurality of process modules is arranged at a different location within the substrate processing tool. A vacuum transfer module (VTM) includes a robot and is configured to move between a plurality of different positions corresponding to the different locations within the substrate processing tool to allow the robot to access respective ones of the plurality of process modules.

In other features, the plurality of process modules is aligned in a first linear direction on either side of a first linear axis of the substrate processing tool and the VTM is configured to move in the first linear direction. The VTM includes at least one opening configured to be aligned with the plurality of process modules on either side of the substrate processing tool. The at least one opening includes a plurality of openings each facing a respective one of the plurality of process modules. The VTM is configured to be rotatable to align the at least one opening with a respective one of the plurality of process modules. The at least one opening is a gate valve. The gate valve includes a port and a vacuum seal. The substrate processing tool further includes a vacuum pump configured to pump down a transfer volume between the gate valve and a respective one of the plurality of process modules.

In other features, the VTM is configured to move in a first linear direction along a first axis of the substrate processing tool and in a second linear direction along a second axis of the substrate processing tool perpendicular to the first axis. The VTM is configured to be raised and lowered in a vertical direction relative to the plurality of processing modules. The substrate processing tool of claim further includes a linear actuator configured to raise and lower the VTM.

In other features, the VTM corresponds to a first VTM and the substrate processing tool further includes a second VTM configured to move between the plurality of different positions. The first VTM and the second VTM are each configured to access each of the plurality of process modules. The first VTM is configured to access a first set of the plurality of process modules and the second VTM is configured to access a second set of the plurality of process modules. The first VTM and the second VTM are each configured to sequentially access the plurality of process modules in a clockwise or counterclockwise manner.

In other features, the second VTM is configured to be raised and lowered in a vertical direction. The second VTM is raised, the second VTM is configured to be moved above and pass over the first VTM. A system includes the substrate processing tool and further includes a controller configured to move the VTM between the different positions.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1A is a plan view of an example substrate processing tool;

FIG. 1B is a plan view of another example substrate processing tool;

In the drawings, reference numbers may be reused to identify similar and/or identical elements.

DETAILED DESCRIPTION

Figure 2A:
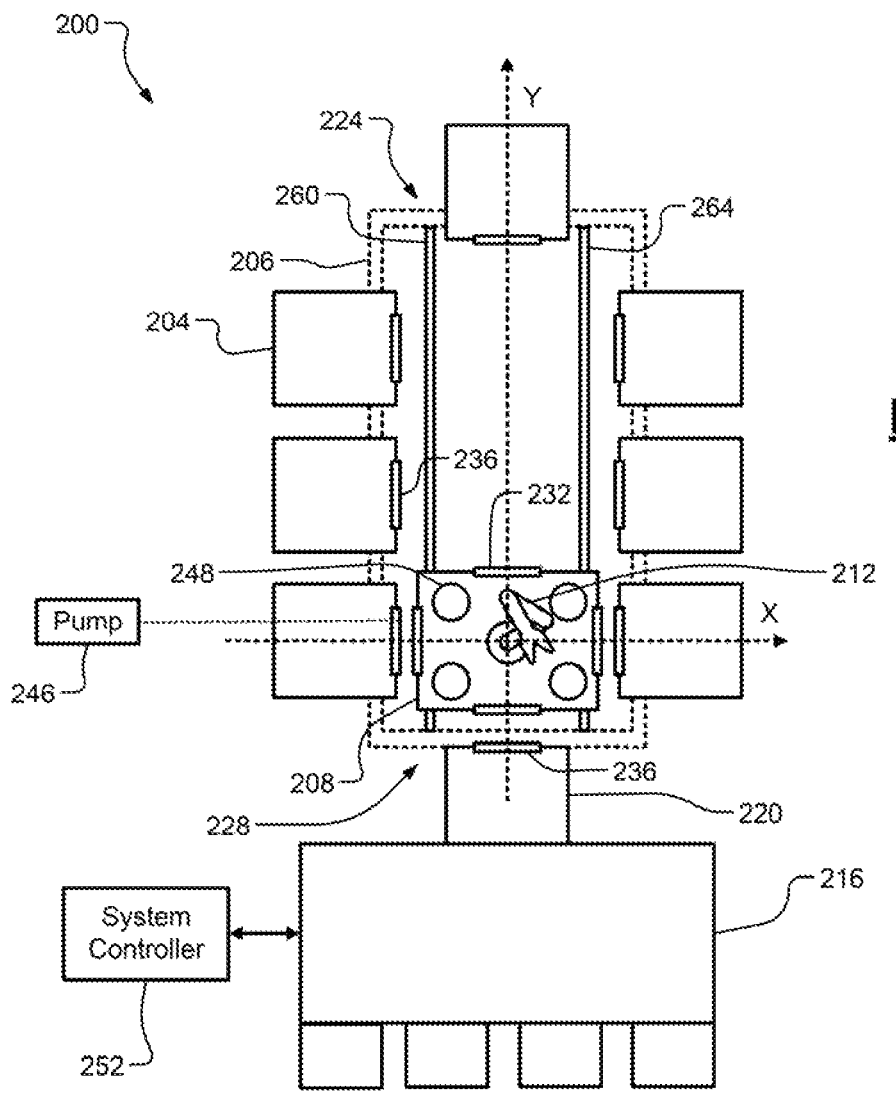
FIG. 2A is a plan view of an example substrate processing tool according to the present disclosure.

The quantity, position, etc. of substrate processing tools within a fabrication room may be constrained by the dimensions and respective configurations of the substrate processing tools. Accordingly, the configurations of the substrate processing tools define a tool footprint, spacing, and/or pitch, which further define a tool density of the fabrication room. Tool density may refer to a number of substrate processing tools and/or process modules per unit area of a fabrication room.

Various substrate processing tool configurations may be implemented to maximize substrate processing tool density. For example, in a plan view, substrate fabrication bays in the fabrication room have a square or rectangular shape, while a substrate processing tool having a radial cluster arrangement has a generally circular shape. Areas defined between the fabrication room walls and an outside diameter of the substrate processing tool constitute unused (and therefore, wasted) space. Accordingly, in a radial cluster implementation (i.e., configuration), efficient use of space in the fabrication room may decrease as a number of process modules per tool increases.

Further, increasing the number of process modules per tool in a radial cluster implementation requires larger chambers (e.g., vacuum transfer modules), larger and/or additional transfer robots, etc. For example, an equipment front end module (EFEM) of a substrate processing tool may include one or more transfer robots for transferring substrates between the EFEM and load locks arranged between the EFEM and the vacuum transfer module (VTM). The VTM includes one or more transfer robots for transferring the substrates between the EFEM and the process modules. Increasing the number and/or reach of these robots may result in lower accuracy and repeatability.

In another example, the substrate processing tool may have a linear implementation. In a linear implementation, the VTM may be rectangular and a plurality of process modules is arranged on each longitudinal side of the VTM. However, in a linear implementation, substrates are transported a greater distance (e.g., relative to a radial cluster implementation) from the EFEM, through the VTM, and to the process modules. Accordingly, a linear implementation may require, for example, multiple transfer robots, increasing cost and VTM volume. Other examples may use a moveable (e.g., in a linear direction) transfer robot. However, a moveable robot may increase particle generation, cables, vacuum lines, etc.

Systems and methods according to the principles of the present disclosure include a linear implementation and a moveable VTM (MVTM). The moveable VTM is configured for movement between components of a substrate processing tool. For example, the VTM may be moved to align the VTM with an airlock (i.e., load lock) of the EFEM to transfer substrates to and from the EFEM and then subsequently aligned with respective process modules to transfer the substrates to and from the process modules.

Accordingly, various cost and operational benefits are provided over existing radial cluster and linear implementations. For example, since only a single, simplified robot may be used to access multiple process modules, costs, servicing, and particle generation associated with multiple robots are reduced. Malfunctions such as leaks are significantly easier to diagnose and service since the VTM has minimal openings and associated seals compared to larger VTMs An overall size of the VTM is also reduced, and stiffening components associated with larger VTMs can be reduced to minimize deflection at vacuum. Further, costs associated with the manufacture and design of the VTM are independent of the process module pitch of a particular tool. Accordingly, the same VTM may be configured for use with process modules having different respective pitches. Scalability and flexibility are therefore increased. For example, if the VTM is damaged or otherwise requires servicing, the VTM can be swapped with a replacement VTM with minimal effort and/or disassembly of the substrate processing tool. Similarly, the VTM, load locks, and slot valves of the substrate processing tool are more readily accessible for cleaning and regular maintenance.

In contrast to existing radial cluster implementations (which include one or more robots configured to access multiple process modules from a given position), the VTM of the present disclosure only needs to be configured to access a single process module at any given time. Accordingly, a length of the robot arm/segments (and therefore an overall footprint of the VTM and the substrate processing tool) can be reduced. Further, a height of the robot and the VTM may be reduced and a volume occupied by support components below the VTM may be minimized, thereby facilitating access to the process modules for servicing.

Conversely, in contrast to existing linear implementations, the robot corresponds to the only moving parts of the VTM of the present disclosure, minimizing particle generation. Further, scalability is improved since the number of process modules is pitch-independent and adding additional process modules to a tool does not require significant modifications. Cost increases are limited to the cost of adding individual process modules, and maintenance and servicing time is reduced since a surface area of the VTM is reduced.

In one example, the VTM may be moved along a first axis (e.g., a Y-axis aligned with a longitudinal axis of the linear implementation of the tool) to align the VTM with the EFEM or a respective process module, and along a second axis (e.g., an X-axis perpendicular to the Y-axis) to engage the VTM with the process module. In this example, the VTM may include multiple openings or valves (e.g., a first valve on a side of the VTM facing the EFEM, a second valve on a second side of the VTM facing process modules on one side of the VTM, a third valve on a third side of the VTM facing process modules on an opposite side of the VTM, etc.). In some examples, the VTM may include a fourth valve on a fourth side of the VTM opposite the EFEM.

In another example, the VTM may be configured to rotate. In this example, the VTM may include only a single valve and the VTM may be rotated to align the valve with the EFEM, process modules on both sides of the VTM, etc. In another example, the VTM may be configured to move only on the Y-axis. In this example, the valves include a pressurized O-ring or other seal that is inflated to seal the VTM to the process module. In another example, the VTM may be moved along the Y-axis in a plane that is above or below corresponding valves of the process modules. In this example, the VTM may be moved along the Y-axis to align the VTM with a process module and then raised upward (or lowered downward) to align the valve of the VTM with the valve of the process module.

FIGS. 1A and 1B show example linear configurations 100-1 and 100-2 including respective substrate processing tools 104-1 and 104-2 having a plurality of process modules 108. In FIG. 1A, the substrate processing tool 104 includes a linear VTM 112 and a single robot 116 configured to transfer substrates between an EFEM 120 (e.g., via a load lock 124) and the process modules 108. Although shown having six of the process modules 108 (e.g., three per side of the VTM 112), the tool 104 may include fewer (e.g., four) or more (e.g., 8, 10, etc.) of the process modules 108. For example, a length of the VTM 112 may be extended to accommodate additional process modules 108. In some examples, the tool 104 may include one or more of the process modules 108 on an end 128 of the VTM 112. Accordingly, the robot 116 is configured to access the load lock 124 and each of the process modules 108. For example, the robot 116 may include additional and/or lengthened arm segments 132 to increase the reach of the robot 116.

In FIG. 1B, the VTM 112 includes a plurality of robots 116 (instead of the single robot 116 of FIG. 1A). For example, the tool 104-2 includes three of the robots 116. Accordingly, in this example, each of the robots 116 is positioned to access a respective pair of the process modules 108. In some examples, the VTM 112 may include one or more storage buffers 136 configured to store one or more substrates between processing stages. In some examples, storage buffers 140 may be located within the VTM 112. In some examples, one or more of the storage buffers 136 may be replaced with process modules or other components.

Figure 2B:
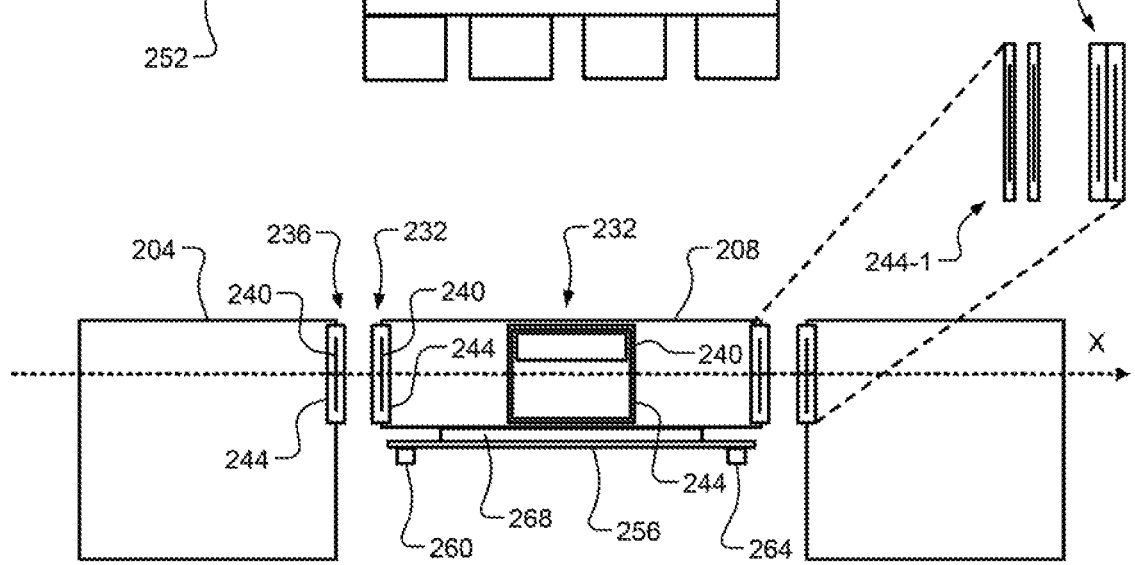
FIG. 2B is a side view of the example substrate processing tool of FIG. 2A.

Referring now to FIGS. 2A and 2B, an example substrate processing tool 200 is shown (in a plan view and a side view, respectively) including a plurality of process modules 204 in a linear configuration according to the principles of the present disclosure. Positions of the process modules 204 may be maintained in the linear configuration using a structure such as a chassis or frame 206. The substrate processing tool 200 includes a moveable VTM 208 and a robot 212 configured to transfer substrates between an EFEM 216 (e.g., via a load lock 220) and the process modules 204. Although shown having seven of the process modules 204 (e.g., three per side of the tool 200 and one on an end 224 of the tool 200 opposite an end 228 corresponding to the EFEM 216), the tool 200 may include fewer (e.g., four) or more (e.g., 8, 9, 10, etc.) of the process modules 204.

The VTM 208 is configured to be moved along a Y-axis between the EFEM 216 at the end 228 of the tool 200 and the end 224 of the tool 200. In particular, a position of the VTM 208 is adjusted to align doors/ports (e.g., gate valves) 232 with corresponding gate valves 236 on the process modules 204 and the load lock 220. As shown, the VTM 208 includes four of the gate valves 232. In this example, the VTM 208 is further configured to move along an X-axis. For example, the position of the VTM 208 is adjusted along the Y-axis to align the gate valves 232 on the VTM 208 with the gate valves 236 on the process modules 204 on respective sides of the tool 200. The position of the VTM 208 is subsequently adjusted along the X-axis (e.g., to the left or right as shown in FIGS. 2A and 2B) to engage ("dock") the gate valve 232 on the VTM 208 with the gate valve 236 of the corresponding process module 204. The robot 212 is configured to access the load lock 220 and each of the process modules 204 via the respective gate valves 232 and 236. In some examples, the robot 212 may include additional or fewer arm segments to optimize the reach of the robot 212.

For example, each of the gate valves 232 and 236 may include a port 240 and a vacuum seal 244. When the VTM 208 is positioned along the X-axis to engage the gate valve 232 with the gate valve 236, the respective vacuum seals 244 create a seal of a volume (i.e., a transfer volume) between the ports 240. For example, movement of the VTM 208 along the X-axis toward the process module 204 causes the respective vacuum seals 244 to compress against each other. In one example, this transfer volume may then be pumped down to a desired pressure (e.g., a stable vacuum transfer pressure). For example, the transfer volume may be connected to a vacuum pump (shown schematically at 246) configured to pump the transfer volume down to the desired pressure prior to opening the gate valves 232 and 236. The gate valves 232 and 236 (i.e., the respective ports 240) may then be opened for transfer of substrates between the VTM 208 and the process module 204 and/or load lock 220 using the robot 212.

In other examples, the transfer volume between the ports 240 and/or the VTM 208 itself may not be connected to a vacuum pump. For example, vacuum may initially be established within the VTM 208 when the VTM 208 is engaged with the load lock 220, one of the process modules 204, etc. since the load lock 220 and the process modules 204 are maintained at vacuum pressures. Accordingly, when the VTM 208 subsequently engages with one of the process modules 204, the vacuum seals 244 allow vacuum within the VTM 208 to be maintained when the gate valves 232 and 236 are opened for the transfer of substrates. Accordingly, even if the vacuum environment of the VTM 208 is compromised during interaction with the load lock 220 and/or one of the process modules 204, vacuum will be reestablished during a next interaction with another one of the process modules 204, the load lock 220, etc.

Subsequent to the substrate transfer, the respective ports 240 are closed and the transfer volume may be vented to atmosphere. The VTM 208 may be repositioned along the X-axis (e.g., away from the process modules 204 and re-centered relative to the tool 200 for transport along the Y-axis (e.g., to a next one of the process modules 204). For example, the VTM 208 may be configured to store multiple substrates (e.g., on shelves, buffers, etc., such as storage buffers 248).

In another example, the VTM 208 may be configured for movement only along the Y-axis. In this example, the vacuum seals 244 of the gate valves 232 and/or 236 may correspond to a pressurized O-ring or other seal. Accordingly, rather than repositioning the VTM 208 along the X-axis to seal the transfer volume, the vacuum seals 244 may be selectively pressurized (e.g., inflated) to cause the vacuum seal 244 on the VTM 208 to compress against the vacuum seal 244 on the process module 204. For example only, an inset of FIG. 2B shows the vacuum seals 244 prior to inflation at 244-1 and subsequent to inflation at 244-2.

In some examples, a region (e.g., an atmospheric region) above the process modules 204 and the VTM 208 may be filtered to prevent accumulation of particulates. In this manner, contamination of the transfer volume may be minimized. In one example, a single fan/filter unit may provide filtering. In other examples, a plurality of fan/filter units may be provided (e.g., a respective fan/filter unit mounted on the VTM 208 above each transfer volume).

A controller (e.g., a system controller 252 may be provided for control of the VTM 208. For example, the system controller 252 may be configured to control movement of the VTM 208, opening and closing of the gate valves 232 and 236, the robot 212, etc.

The VTM 208 may be configured for movement using any suitable mechanism. For example, the VTM 208 may be mounted on a platform 256 arranged to be moved along rails (e.g., in a cross roller slide arrangement) 260 and 264 on the Y-axis. A similar mechanism 268 may be mounted on the platform 256 for providing movement along the X-axis.

Figure 3A:
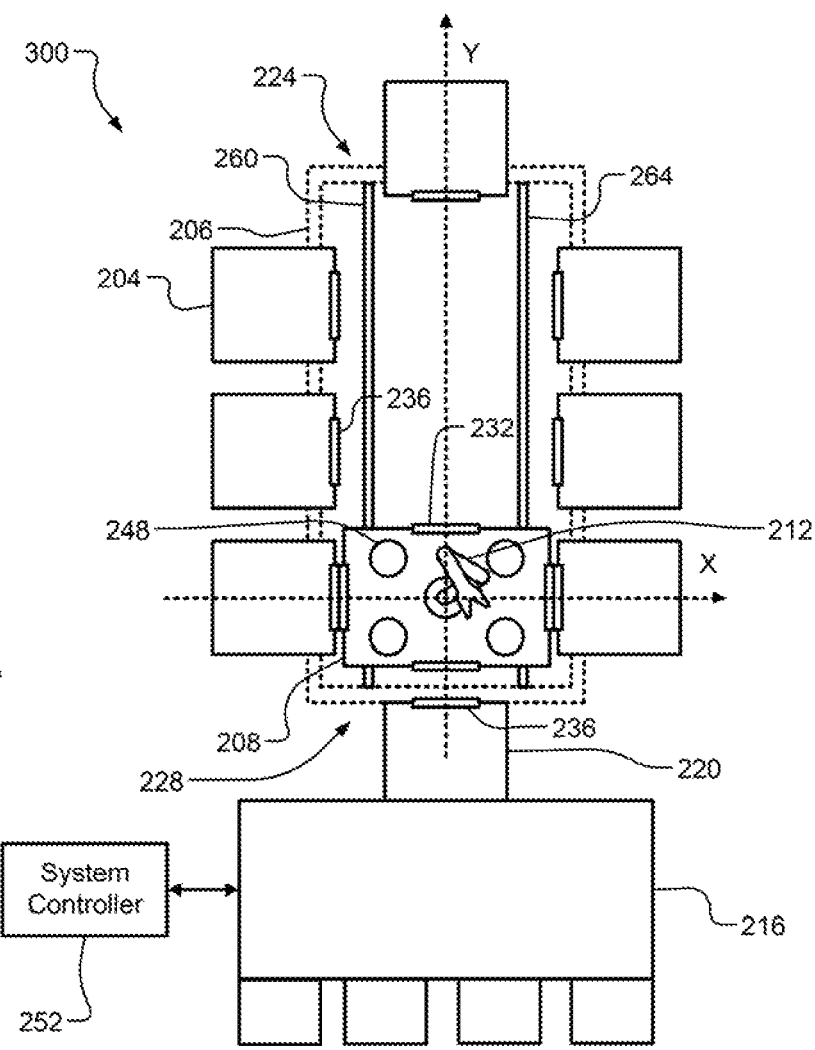
FIG. 3A is a plan view of another example substrate processing tool according to the present disclosure.
Figure 3B:
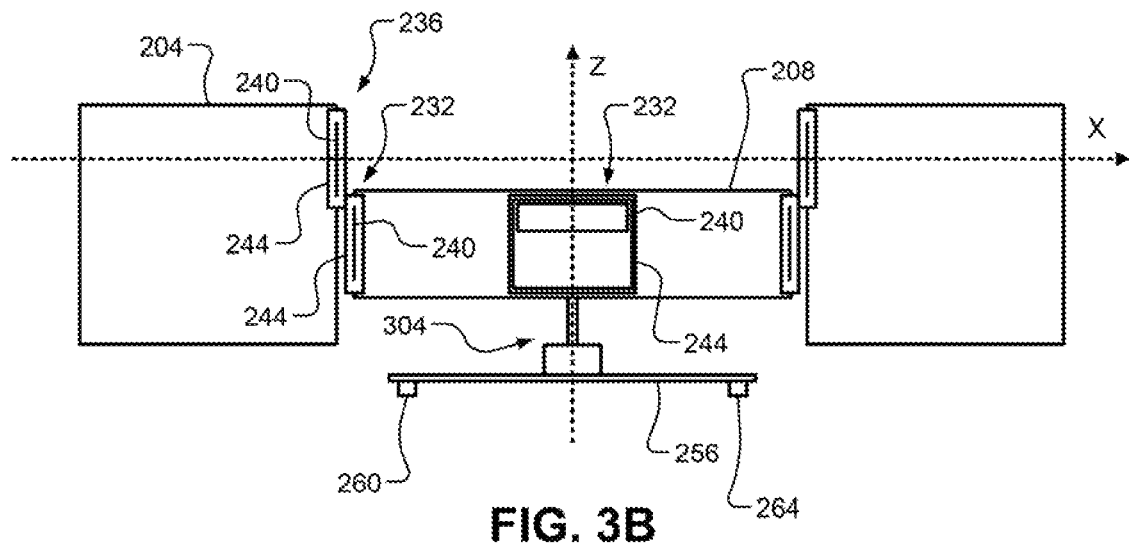
FIG. 3B is a side view of the example substrate processing tool of FIG. 3A.

Referring now to FIGS. 3A and 3B, another example substrate processing tool 300 according to the principles of the present disclosure is shown (in a plan view and a side view, respectively). In this example, the VTM 208 may not be configured to be moved along the X-axis. Instead, the VTM 208 is configured to be moved upward and downward along a Z-axis. For example, the VTM 208 may be mounted on a mechanism 304 configured to raise and lower the VTM 208, such as a linear actuator (as shown), robot arm, etc. In this manner, the VTM 208 may be moved along the Y-axis in a plane below or above the gate valves 236 and then raised (or lowered) to align the gate valves 232 with the gate valves 236. Raising or lowering the VTM 208 causes the respective vacuum seals 244 to contact and compress against each other. Accordingly, movement along the X-axis is not necessary to seal the transfer volume. In this example, the vacuum seals 244 may be pressurized/inflatable as described in FIGS. 2A and 2B to improve sealing of the transfer volume.

Figure 4A:
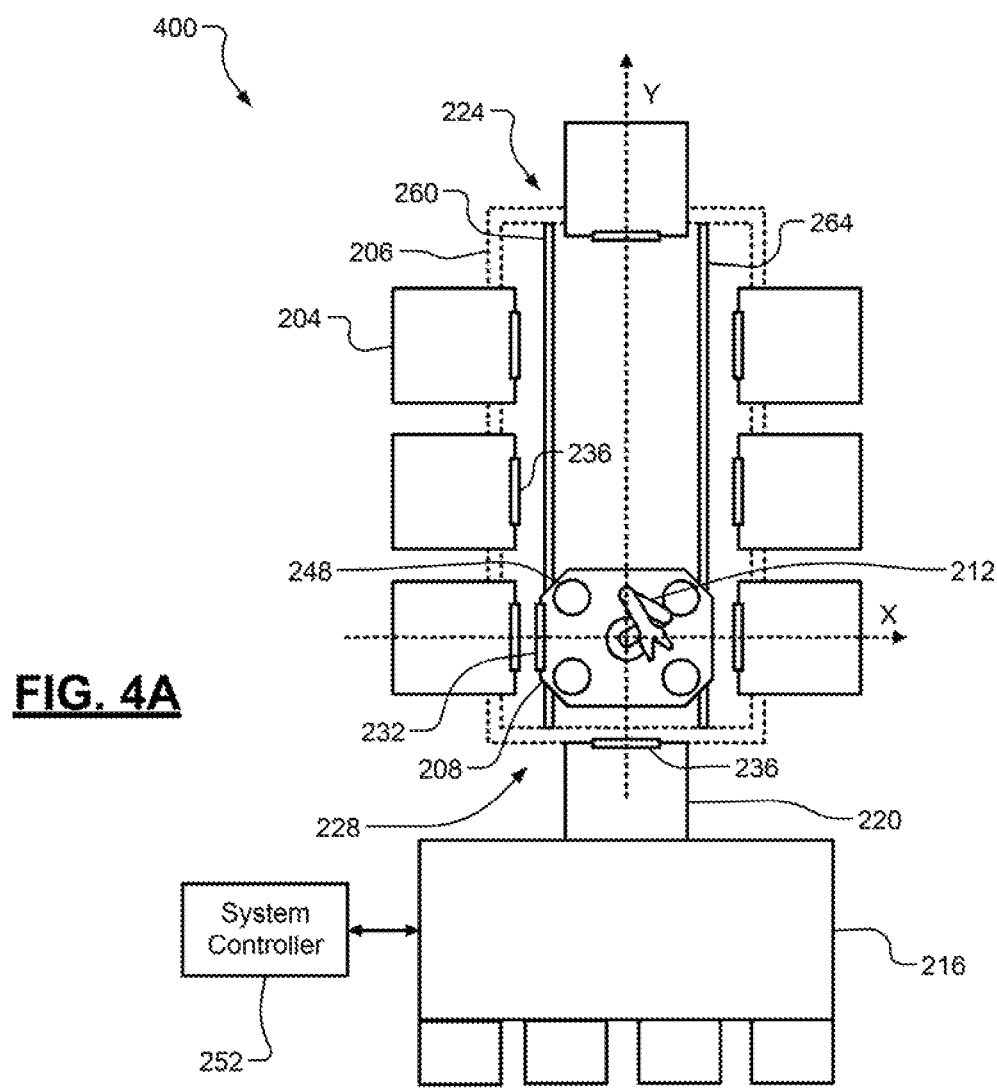
FIG. 4A is a plan view of another example substrate processing tool according to the present disclosure.
Figure 4B:
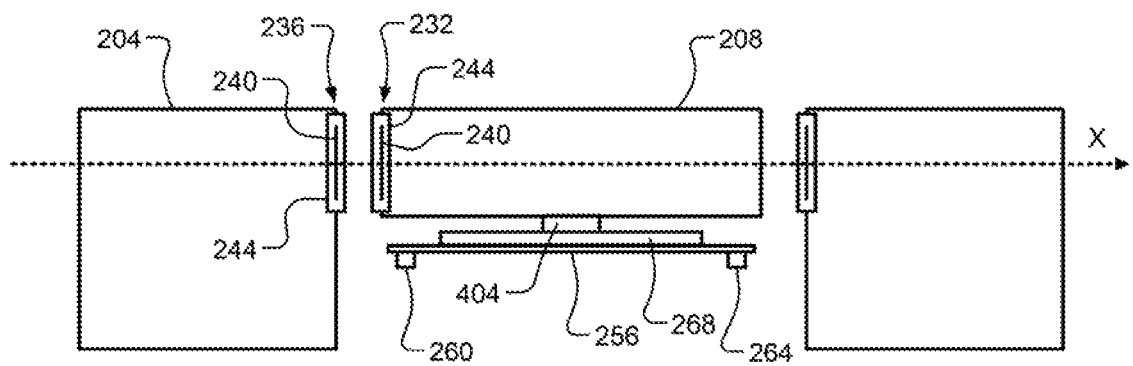
FIG. 4B is a side view of the example substrate processing tool of FIG. 4A.

Referring now to FIGS. 4A and 4B, another example substrate processing tool 400 according to the principles of the present disclosure is shown (in a plan view and a side view, respectively). In this example, the VTM 208 may not include the gate valves 232 on each side of the VTM 208. Instead, the VTM 208 may include fewer (e.g., only one) gate valve 232 and is configured to be rotated to align the gate valve 232 with a selected one of the process modules 204, the load lock 220, etc. For example, the VTM 208 may be mounted on a rotating mechanism 404 configured to rotate the VTM 208. In this manner, three of the four gate valves 232 may be eliminated. In this example, VTM 208 may be moveable along the X-axis as described in FIGS. 2A and 2B, the vacuum seals 244 may be pressurized/inflatable, the VTM 208 may be configured to be raised/lowered as described in FIGS. 3A and 3B, etc. In some examples, corners of the VTM 208 may be angled/chamfered as shown to facilitate rotation.

Figures 5A, 5B:
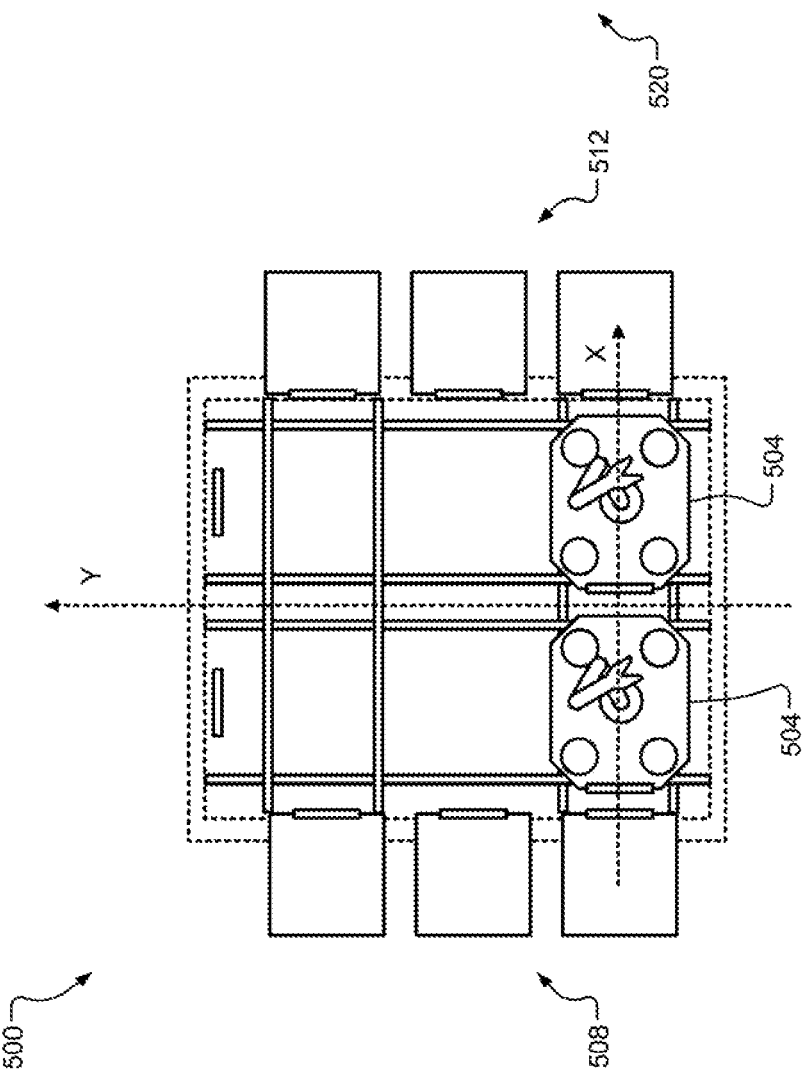
FIG. 5A is a plan view of another example substrate processing tool according to the present disclosure.
FIG. 5B is a side view of an example arrangement of vacuum transfer modules according to the present disclosure.

Moveable VTMs according to the principles of the present disclosure may be implemented in different configurations and arrangements in other example substrate processing tools. For example, as shown in FIG. 5A, an example substrate processing tool 500 may include two more VTMs 504. In this example, each of the VTMs 504 may be configured to move along a first axis (e.g., on rails arranged parallel to a Y-axis aligned with a longitudinal axis of the linear implementation of the tool) and along a second axis (e.g., on rails aligned parallel to an X-axis perpendicular to the Y-axis). In this manner, each of the VTMs 504 may be moved to access either process modules 508 on a first side of the substrate processing tool 500 or process modules 512 on a second side of the substrate processing tool 500. In other examples, rather than separate sets of perpendicular rails, the substrate processing tool 500 may include a single set of rales in a circular or elliptical shape. In some examples, each of the VTMs 504 may be controlled to access the process modules 508 and 512 sequentially in a clockwise or counterclockwise direction. In another example, one of the VTMs 504 may be controlled to access only the process modules 508 on the first side of the substrate processing tool 500 while the other of the VTMs 504 may be controlled to access only the process modules 512 on the second side of the substrate processing tool 500. In still another example, one of the VTMs 504 may be dedicated to transporting only processed substrates while the other of the VTMs 504 may be dedicated to transporting only unprocessed substrates.

In another example as shown in a side view in FIG. 5B, in a substrate processing tool including two VTMs 520 and 524, one or more of the VTMs 524 may be configured to be raised and lowered similar to the example shown in FIGS. 3A and 3B. Accordingly, the VTM 524 may be raised above the VTM 520 to allow the VTMs 520 and 524 to pass over/under one another when moving in the Y direction.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing tool, comprising:
   a frame;
   a plurality of process modules configured to process a semiconductor substrate, wherein each of the plurality of process modules is arranged and supported on the frame at a different fixed location within the substrate processing tool, and wherein the plurality of process modules is aligned in a first linear direction on either side of a first linear axis of the substrate processing tool; and
   a vacuum transfer module (VTM) supported within the frame of the substrate processing tool along the first linear axis and between rows of the plurality of process modules, the VTM including a robot, wherein the VTM is a chamber that defines an interior volume, the robot is arranged in the interior volume of the VTM, and the VTM is configured to maintain vacuum within the interior volume,
   wherein the VTM is configured to move in the first linear direction between a plurality of different positions corresponding to the different fixed locations within the substrate processing tool to allow the robot to access respective ones of the plurality of process modules wherein the VTM is configured to be raised and lowered in a vertical direction relative to the plurality of processing modules.

2. The substrate processing tool of claim 1, wherein the VTM includes at least one opening configured to be aligned with the plurality of process modules on either side of the substrate processing tool.

3. The substrate processing tool of claim 2, wherein the at least one opening includes a plurality of openings each facing a respective one of the plurality of process modules.

4. The substrate processing tool of claim 2, wherein the VTM is configured to be rotatable to align the at least one opening with a respective one of the plurality of process modules.

5. The substrate processing tool of claim 2, wherein the at least one opening is a gate valve.

6. The substrate processing tool of claim 5, wherein the gate valve includes a port and a vacuum seal.

7. The substrate processing tool of claim 5, further comprising a vacuum pump configured to pump down a transfer volume between the gate valve and a respective one of the plurality of process modules.

8. The substrate processing tool of claim 1, wherein the VTM is further configured to move in a second linear direction along a second axis of the substrate processing tool perpendicular to the first axis.

9. The substrate processing tool of claim 1, further comprising a linear actuator configured to raise and lower the VTM.

10. The substrate processing tool of claim 1, wherein the VTM corresponds to a first VTM and further comprising a second VTM configured to move between the plurality of different positions.

11. The substrate processing tool of claim 10, wherein the first VTM and the second VTM are each configured to access each of the plurality of process modules.

12. The substrate processing tool of claim 10, wherein the first VTM is configured to access a first set of the plurality of process modules and the second VTM is configured to access a second set of the plurality of process modules.

13. The substrate processing tool of claim 10, wherein the first VTM and the second VTM are each configured to sequentially access the plurality of process modules in a clockwise or counterclockwise manner.

14. The substrate processing tool of claim 10, wherein the second VTM is configured to be raised and lowered in a vertical direction.

15. The substrate processing tool of claim 14 wherein, when the second VTM is raised, the second VTM is configured to be moved above and pass over the first VTM.

16. A system comprising the substrate processing tool of claim 1 and further comprising a controller configured to move the VTM between the different positions.

* * * * *